US012562740B2

(12) United States Patent
Delshadpour et al.

(10) Patent No.: US 12,562,740 B2
(45) Date of Patent: Feb. 24, 2026

(54) REDRIVER CIRCUIT

(71) Applicant: NXP USA, Inc., Austin, TX (US)

(72) Inventors: Siamak Delshadpour, Phoenix, AZ (US); Xu Zhang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 136 days.

(21) Appl. No.: 18/467,213

(22) Filed: Sep. 14, 2023

(65) Prior Publication Data

US 2025/0093934 A1 Mar. 20, 2025

(51) Int. Cl.
*H03K 19/0175* (2006.01)
(52) U.S. Cl.
CPC ................................ *H03K 19/0175* (2013.01)
(58) Field of Classification Search
None
See application file for complete search history.

(56) References Cited

U.S. PATENT DOCUMENTS 4,625,271 A 11/1986 Chetty et al.
6,346,834 B1 * 2/2002 Chai .................... H03K 17/223
327/66

6,693,863 B2 * 2/2004 Shoji ................ G11B 20/10027
7,009,827 B1 3/2006 Lee et al.
7,986,159 B1 * 7/2011 Ahmad ................. G06F 3/0676
326/38
8,212,587 B2 * 7/2012 Yeung ................. H04L 25/0286
326/82
8,493,092 B2 * 7/2013 Rajaee ............. H04L 25/03885
326/88

(Continued)

OTHER PUBLICATIONS

U.S. Appl. No. 17/990,603, filed Nov. 18, 2022; 46 pages.
U.S. Appl. No. 17/990,605, filed Nov. 18, 2022; 34 pages.

*Primary Examiner* — Thomas J. Hiltunen

(57) ABSTRACT

One example discloses a driver circuit, comprising: a first transistor ($Q_{TN}$) coupled to a first differential input (IN) and a power supply input (VCC); a second transistor ($Q_{TP}$) coupled to a second differential input (IP) and the power supply input; a third transistor ($Q_{BN}$) coupled to a first differential output (ON); a fourth transistor ($Q_{BP}$) coupled to a second differential output (OP); a first resistance ($R_{P1}$) coupling the first transistor ($Q_{TN}$) to the third transistor ($Q_{BN}$); a second resistance ($R_{P2}$) coupling the second transistor ($Q_{TP}$) to the fourth transistor ($Q_{BP}$); and a controller coupled to the power supply input; wherein the controller is configured to detect a ramp-down of a power supply coupled to the power supply input and in response disable a set of circuit elements in the driver circuit.

18 Claims, 7 Drawing Sheets

(56)  References Cited

U.S. PATENT DOCUMENTS

| | | | |
|---|---|---|---|
| 10,812,067 B1 | 10/2020 | Delshadpour et al. | |
| 11,349,463 B2 * | 5/2022 | Delshadpour | ....... H04L 12/2801 |
| 2014/0210520 A1 * | 7/2014 | Harris | ................. H04L 25/0276 |
| | | | 327/108 |
| 2023/0402980 A1 * | 12/2023 | Cosentino | ................. H03F 3/72 |
| 2024/0171203 A1 * | 5/2024 | Bien | .................... H04B 1/0458 |

* cited by examiner

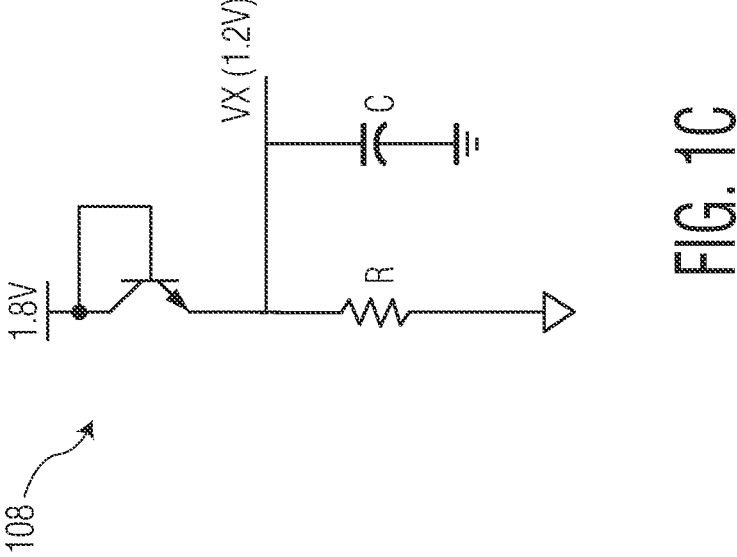
VX (1.2V)
1.8V
R
C
108
FIG. 1C
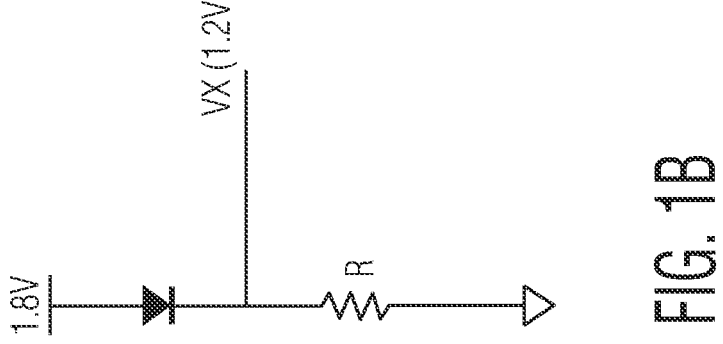
VX (1.2V)
1.8V
R
106
FIG. 1B
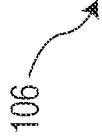

316

320

322

324

326

REDRIVER CIRCUIT

The present specification relates to systems, methods, apparatuses, devices, articles of manufacture and instructions for driving signals.

SUMMARY

According to an example embodiment, a driver circuit, comprising: a first transistor ($Q_{TN}$) coupled to a first differential input (IN) and a power supply input (VCC); a second transistor ($Q_{TP}$) coupled to a second differential input (IP) and the power supply input; a third transistor ($Q_{BN}$) coupled to a first differential output (ON); a fourth transistor ($Q_{BP}$) coupled to a second differential output (OP); a first resistance ($R_{P1}$) coupling the first transistor ($Q_{TN}$) to the third transistor ($Q_{BN}$); a second resistance ($R_{P2}$) coupling the second transistor ($Q_{TP}$) to the fourth transistor ($Q_{BP}$); a first capacitance ($C_{F1}$) coupling the first transistor ($Q_{TN}$) to a control line of the fourth transistor ($Q_{BP}$); a second capacitance ($C_{F2}$) coupling the second transistor ($Q_{TP}$) to a control line of the third transistor ($Q_{BN}$); and a controller coupled to the power supply input; wherein the controller is configured to detect a ramp-down of a power supply coupled to the power supply input and in response disable a set of circuit elements in the driver circuit.

In another example embodiment, the controller is configured to detect a ramp-up of the power supply a preset time period after the power supply begins the ramp-up.

In another example embodiment, the controller includes a first controller sub-circuit 320 coupled to the power supply input; the first controller sub-circuit 320 is configured to generate an enable signal (TX_En) in response to receiving another enable signal (TX_Enable); and the set of circuit elements in the driver circuit are configured to receive the enable signal (TX_En) and in response control their operation.

In another example embodiment, the first controller sub-circuit 320 includes a POR (power on reset) circuit 321.

In another example embodiment, the POR circuit has a reset threshold voltage that is higher than a predetermined value for power indication usage.

In another example embodiment, a reset threshold of the POR circuit is configured to detect the ramp-down of the power supply In another example embodiment, a reset threshold of the POR circuit is configured to detect a ramp-up of the power supply a preset time period after the power supply begins the ramp-up.

In another example embodiment, the set of circuits in the driver circuit includes a voltage regulator circuit coupled between the power supply input and both the first transistor ($Q_{TN}$) and the second transistor ($Q_{TP}$); and the voltage regulator circuit is configured to couple the first transistor ($Q_{TN}$) and the second transistor ($Q_{TP}$) to the power supply input ($V_{CC}$) if the enable signal (TX_En) is in a first state and to a voltage set by resistor and diode connected devices if the enable signal (TX_En) is in a second state.

In another example embodiment, the set of circuits in the driver circuit includes a first set of differential input (IP) switches 310 coupled to the first differential input (IN) and a second set of differential input (IN) switches 312 coupled to the second differential input (IP); and the first and second differential input switches are configured to couple the first and second differential inputs to a first voltage if the enable signal (TX_En) is in a first state and to a second voltage if the enable signal (TX_En) is in a second state.

In another example embodiment, wherein the driver circuit includes: a first switched resistance 302 coupled in parallel with the first capacitance ($C_{F1}$); a second switched resistance 304 coupled in parallel with the second capacitance ($C_{F2}$); a third switched resistance 306 coupling the control line of the third transistor ($Q_{BN}$) to a ground; and a fourth switched resistance 308 coupling the control line of the fourth transistor ($Q_{BP}$) to the ground.

In another example embodiment, the controller includes a second controller sub-circuit 320 coupled to the power supply input; and the second controller sub-circuit 320 is configured to send an enable signal (SWO_Enable (En0)) to the third and fourth switched resistances 306, 308 after a predetermined delay from when a voltage signal at the power supply input changes (e.g. ramp-up and ramp-down).

In another example embodiment, the controller includes a third controller sub-circuit 322 coupled to receive the enable signal (TX_En) from the first controller sub-circuit 320; and the third controller sub-circuit 322 is configured to send an enable signal (SW1_Enable (En1)) to the first and second switched resistances 302, 304 after a first delay (t1) from when the enable signal (TX_En) transitions from a first state to a second state, and after a second delay (t2) from when the enable signal (TX_En) transitions from the second state to the first state.

In another example embodiment, the third controller circuit 322 is a one-shot circuit.

In another example embodiment, the driver circuit is embedded in a redriver circuit.

In another example embodiment, the redriver circuit is a voltage-mode redriver circuit.

In another example embodiment, the first differential output (OP) and the second differential output (ON) are configured to be directly connected to a capacitor in-series; and the first differential input (IP) and the second differential input (IN) are configured to be directly connected to a capacitor in-series.

In another example embodiment, the third transistor ($Q_{BN}$) is configured to be coupled to a load through a first decoupling capacitor (Cex) that is in-series with the first load; and the fourth transistor (QBP) is configured to be coupled to the load through a second decoupling capacitor (Cex) that is also in-series with the load.

In another example embodiment, the controller is configured to detect the ramp-down of the power supply coupled to the power supply input before the power supply is configured to detect the ramp-down.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

BRIEF DESCRIPTION OF THE DRAWINGS

FIGS. 1A, 1B, 1C represent a first example TX (transmit) driver circuit and supporting circuitry embedded in a redriver circuit.

Figure 1A:
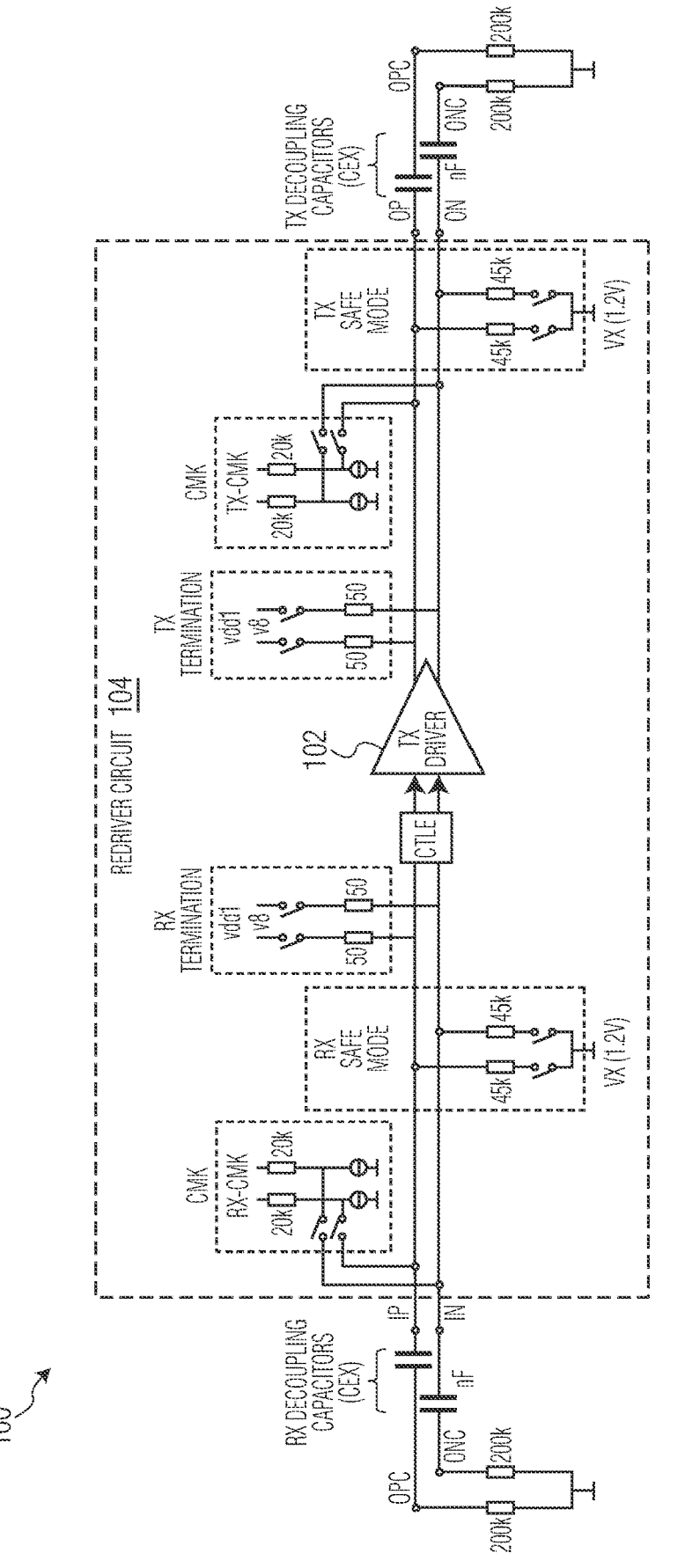

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Redriver circuits support a variety of signal conditioning functions in various communication pathways and circuit designs. For example, redrivers can compensate for signal loss, maintaining signal integrity, extend link distances and help with compliance tests. Redrivers actively regenerate signals using an equalizer and amplifier. This reshapes received signals, removes jitters and enables longer channel transmissions with reduced bit error rates.

Some example redrivers must support various operational modes, including: power supply ramp-up (i.e. going from "no supply to supply available), power supply ramp-down (i.e. going from "supply available to no supply"), deep power saving, safe state, RX detect which is the far end termination detector, LFPS, LoS (loss of signal) detect, and so on.

Because in many example applications, redrivers are connected to other circuit elements with large decoupling capacitors placed in-series with the redriver's inputs and outputs to isolate DC voltage levels between the redriver circuit and these various other circuit elements.

However, when a redriver switches between various operational modes, voltage levels at their inputs or outputs may jump/spike, and such voltage jumps/spikes will pass right through the decoupling capacitors, since a capacitance at high-frequency acts like a short-circuit. These voltage jumps can damage these other circuit elements.

To address this concern, many redrivers include a voltage jump control circuit to reduce or limit such voltage jumps/spikes at the redriver's inputs and outputs during redriver mode changes.

Now discussed are example embodiments of driver circuits (e.g. voltage-mode redrivers) that include novel voltage jump control circuits that reduces voltage jump at the driver circuit's output while the power supply disappears or shows up. In some example embodiments, such novel driver circuits can limit voltage jumps/spikes at their output pins to within −0.5V and 1V (unterminated) or −0.3V and 1V (terminated) during various operational mode changes such as ramp-up and ramp-down of power supply.

Variously the driver circuits can be used in level-shifter circuits, redriver (linear or limiting) circuits, and/or voltage mode TX driver circuits that need to meet USB standards. These driver circuits can be used for any kind USB/TBT/DP/CIO/PCIe compatible redriver output/input that needs to be compliance with USB standard. The driver circuits enable soft connection of an old technology with high supply and a more advanced technology with lower supply and lower absolute maximum voltage of devices/pins.

FIGS. 1A, 1B, 1C represent a first example 100 TX (transmit) driver circuit and supporting circuitry embedded in a redriver circuit 104. The redriver circuit 104 includes: the TX driver circuit 102, a receive (RX) CMK (common mode keeper), a transmit (TX) CMK (common mode keeper), a CTLE (continuous time linear equalizer), an RX safe mode resistor, a TX safe mode resistor, an RX termination ($R_T$) (50Ω), a TX termination ($R_T$) (50Ω), differential inputs (IP, IN), differential outputs (OP, ON), RX decoupling capacitors (Cex), and TX decoupling capacitors (Cex).

The RX safe mode resistor and TX safe mode resistor receive a VX voltage from supporting circuitry shown in FIGS. 1B and 1C. FIG. 1B shows a first VX voltage generating circuit 106, and FIG. 1C shows a second VX voltage generating circuit 108. VX necessarily doesn't need to be 1.2V, but in general a voltage close to that will be enough to get the needed performance.

The voltage VX is close to a DC operation point of the differential inputs (IP, IN) and/or differential outputs (OP, ON) on the high-speed pins. The diode shown in FIG. 1B can be a diode connected device if there is no bipolar transistor in the used process node (e.g. a diode connected NMOS transistor).

In some example embodiments, the RX termination ($R_T$) (50Ω) and the TX termination ($R_T$) (50Ω) are coupled to a power supply (VDD1). In other example embodiments, they can be terminated to ground. For a voltage mode TX driver, the TX termination ($R_T$) (50Ω) can be part of the TX driver. The input RX termination ($R_T$) (50Ω) and/or output TX termination ($R_T$) (50Ω) can be terminated to ground to avoid or significantly reduce voltage jump issue during mode changes. The 50Ω valued can be different for different standards, e.g. 40Ω or 45Ω. A level shifter between the differential inputs (IP, IN) and an input of the CTLE shifts voltage to a proper DC voltage needed for an input node of CTLE.

The differential inputs (IP, IN) and the differential outputs (OP, ON) of the redriver circuit 104 are decoupled by the RX decoupling capacitors (Cex), and TX decoupling capacitors (Cex) that in some example embodiments are about 100 nF capacitors. Additional 200 kΩ resistors at the differential inputs (IP, IN) and the differential outputs (OP, ON) represent unterminated high-speed pins when a chip connected to the redriver circuit 104 without a 50Ω termination.

Figure 2:
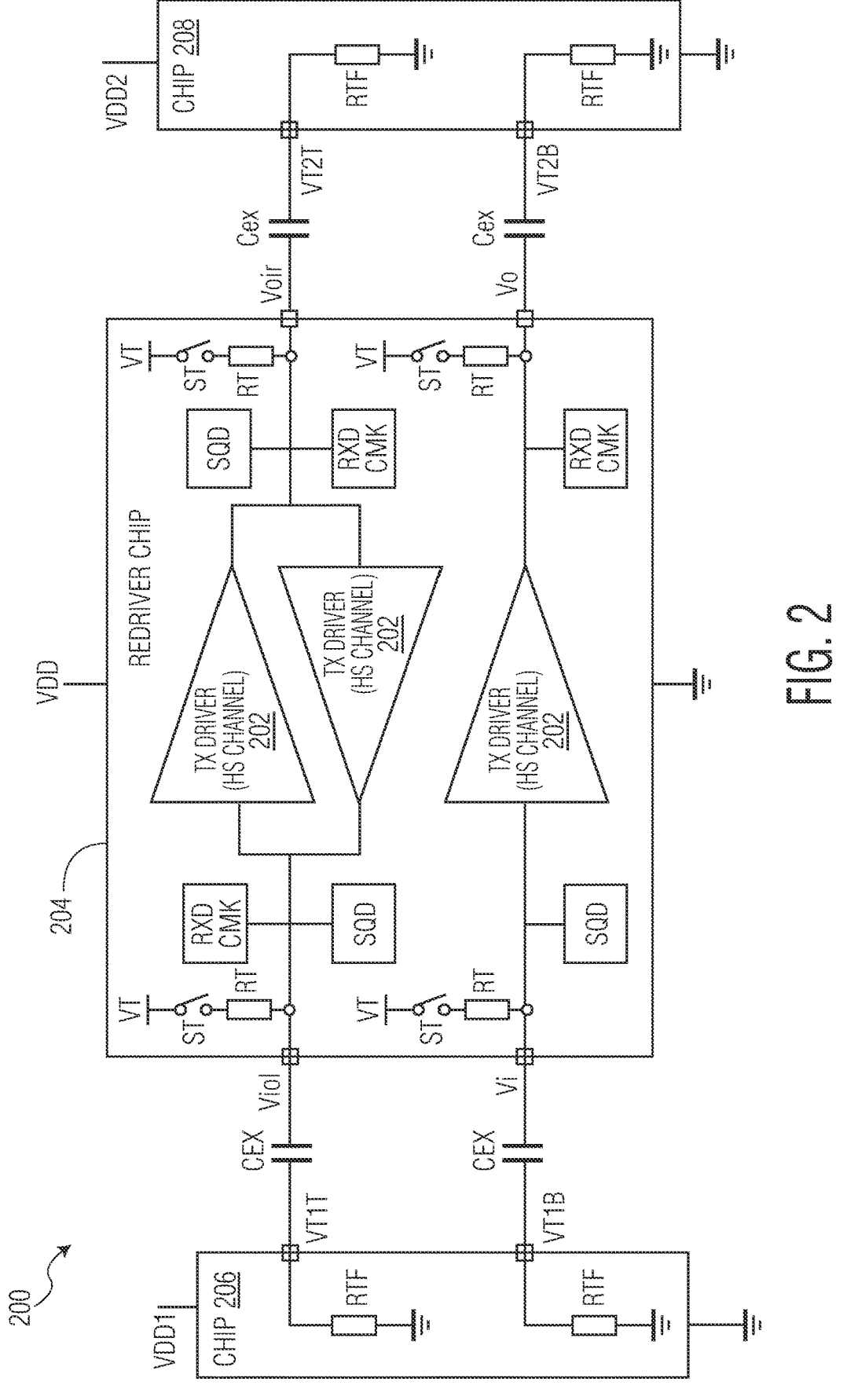
FIG. 2 represents a second example driver circuit embedded in a redriver circuit.

FIG. 2 represents a second example 200 driver circuit 202 embedded in a redriver circuit 204. The redriver circuit 204 includes a set of TX driver circuits 202 along with various other impedance and signal monitoring elements.

The redriver circuit 204 includes a bi-directional and a uni-directional high-speed repeater, shown as single-ended, but typically is differential in most applications. In some example embodiments, each of these high-speed channels are similar to the redriver circuit 104 of FIG. 1A.

The SQD is a squelch/signal detector (a.k.a. LoS (loss of signal) detector) which can be an LFPS detector and/or a high-speed signal detector. RXD is RX detect from single-ended or differential (not shown) input pins at each node where an input signal could be received. The CMK (common mode keeper) keeps a DC level of the high-speed pins at desired level. $R_T$ is the RX and TX termination ($R_T$) (50Ω) which are switched in/out by enabling/disabling the ST switches.

Far-end termination resistors (RTF) within external chip 206 and external chip 208 (e.g. within a same chip, circuit board or on different circuit boards) that are coupled to the redriver circuit 204 can be either equal to $R_T$=50Ω, open, or within 10 kΩ-200 kΩ depending upon the communications/interface standard. VDD1 and VDD2 can be different values compared to the VDD of the redriver circuit 204.

Cex represents a capacitance of the RX decoupling capacitors (Cex) and TX decoupling capacitors (Cex). Cex in various example embodiments has a large value (e.g. depending upon the USB standard) and could be ~100 nF to ~300 nF so as to isolate the redriver circuit 204 and the external chips 206, 208 from each other's DC voltages.

During operational mode change of the redriver circuit 204, any voltage jump/spike (ΔV) at pins (Voir, Vo) and (Viol, Vi) can be large, and due to the large value of the decoupling capacitors (Cex), the voltage jumps/spikes can be passed to pins (VT2T, VT2B) and (VT1T, VT1B) on the external chips 206, 208 and damage them. For example, if the redriver circuit 204 operates in a 1.8V or 3.3V domain and chips 1 (206) or 2 (208) are in a 1V domain, then the large voltage jump/spike (ΔV) will be seen by external chips 206, 208 and can damage them.

By keeping the redriver circuit's 204 functional DC voltage around middle of the rail (VDD/2) reduces a maximum voltage jump/spike (ΔV) to half of what it could otherwise be. However, during power supply ramp-up or ramp-down mode changes, the voltage jump/spike (ΔV) at Vio and/or Voi can still exceed desired maximum values.

One of the main reasons for the voltage jump/spike (ΔV) during power supply (VDD) ramp-up-ramp-down mode changes is that the $R_T$ termination resistors are switchable (i.e. by ST switches). For example, embodiments where the $R_T$ termination resistors are connected to a voltage VT, the gate control circuit of them have no clear correlation with the power supply (VDD) ramp-down or ramp-up and they can be enabled/disabled by the switches ST at a non-desired time which can cause a large voltage jump/spike (ΔV) that will be passed to the chip1 (206) and/or chip2 (208).

Similarly, when the TX driver gets disabled or enabled or in supply ramp-up/down case, any voltage jump/spike (ΔV) from base of TX driver output will be transferred to output pins as well. This means that the redriver circuit 204 with a VDD supply should follow a compliance rule that when external chips 206, 208 show a 50Ω RTF resistance or an open (e.g. 200 kΩ) RTF resistance, then the redriver circuit 204 should control its voltage jump at the load at pins VT2T, VT2B and VT1T, VT1B.

For the case of power supply ramp-up/down, a fast indicator of supply availability/non-availability will help to control the ST switches properly to reduce voltage jump. Additionally, the redriver circuit 204 can minimize the voltage jump/spike (ΔV) from any internal mechanism that can cause voltage jump on a high-speed pin, and/or maximize an equivalent resistance ($R_{chip}$) of the redriver chip 204 in the voltage jump events, which is around 50Ω when redriver circuit's 204 termination is turned on but has a much higher value when the termination is off. In most cases, 200 kΩ is the most challenging far-end termination (RTF) to minimize the voltage jump due to its high value.

During power supply ramp-up/down of the redriver circuit 204, high speed pins start to settle to their targeted CM (common mode) voltages set by either CMK circuits or safe mode resistors. The targeted CM values are optimized considering the CM differences of all modes. Circuits connected to the pins are optimized to have high impedance during these events. As a results, divided outputs are seen at the connect sides. For example, even if the redriver circuit's 204 high-speed pin have their CM settled to ~1.2V, a voltage jump at the connect side (after the AC coupling cap Cex) may be 0.5V and 1V when RTF=200 kohm. Also, to reduce the voltage jump/spike (ΔV), the RX termination ($R_T$) (50Ω) of an input could be terminated to ground during various operational mode changes.

FIGS. 3A, 3B, 3C, 3D, 3E, 3F represent a third example driver circuit 300 and controller circuitry. Example embodiments of the redriver circuit 300 can be embedded in various circuits including the first example 100 TX driver circuit 102 and the second example 200 TX driver circuit 202 with the added supporting circuitries to TX driver for voltage jump control.

The driver circuit 300 includes: a first differential input (IP), a second differential input (IN), a first differential output (OP), a second differential output (ON), a first switched resistance 302, a second switched resistance 304, a third switched resistance 306, a fourth switched resistance 308, a first set of differential input (IP) switches 310, a second set of differential input (IN) switches 312, decoupling capacitors (Cex), a first example voltage regulator (Vreg) 314, and a controller 318. A second example voltage regulator (Vreg) 316 is shown FIG. 3B.

The first transistor ($Q_{TN}$) is coupled to the first differential input (IN) and a power supply input ($V_{CC}$) through either the first example voltage regulator (Vreg) 314 or the second example voltage regulator (Vreg) 316. The second transistor ($Q_{TP}$) is coupled to the second differential input (IP) and to the power supply input in a similar manner.

The third transistor ($Q_{BN}$) is coupled to a first differential output (ON), the fourth transistor ($Q_{BP}$) coupled to a second differential output (OP). A first resistance ($R_{P1}$) couples the first transistor ($Q_{TN}$) to the third transistor ($Q_{BN}$). A second resistance ($R_{P2}$) couples the second transistor ($Q_{TP}$) to the fourth transistor ($Q_{BP}$). A first capacitance ($C_{F1}$) couples the first transistor ($Q_{TN}$) to a control line of the fourth transistor ($Q_{BP}$). A second capacitance ($C_{F2}$) couples the second transistor ($Q_{TP}$) to a control line of the third transistor ($Q_{BN}$).

The controller is coupled to the power supply input and is configured to detect a ramp-down of a power supply (not shown) coupled to the power supply input and in response disable a set of circuit elements in the driver circuit. The controller is also configured to detect a ramp-up of the power supply a preset time period after the power supply begins the ramp-up. In some example embodiments the controller is configured to receive driver enable signal (TX_Enable) from the central digital control, and in other example embodiments is configured to generate the internal driver enable signals (TX_Enb and TX_En) based in a predetermined voltage level at the power supply input.

While this example driver circuit 300 is in a voltage-mode configuration, other example embodiments of the driver circuit 300 may have different configurations.

The controller 318 include a set of sub-circuits 320, 322, 324 that are configured to generate and send control signals to the various circuit elements in the TX driver 300. These control signals include an enable signal (TX_En) and its logical complement (TX_Enb). These control signals also include enable signals (e.g. $S_{W0}$_Enable (En0) and $S_{W1}$_Enable (En1)) sent to the switched resistances 302, 304, 306, 308. Examples of these sub-circuits 320, 322, 324 are presented in FIGS. 3C, 3D, 3E which are discussed below.

Figure 3A:
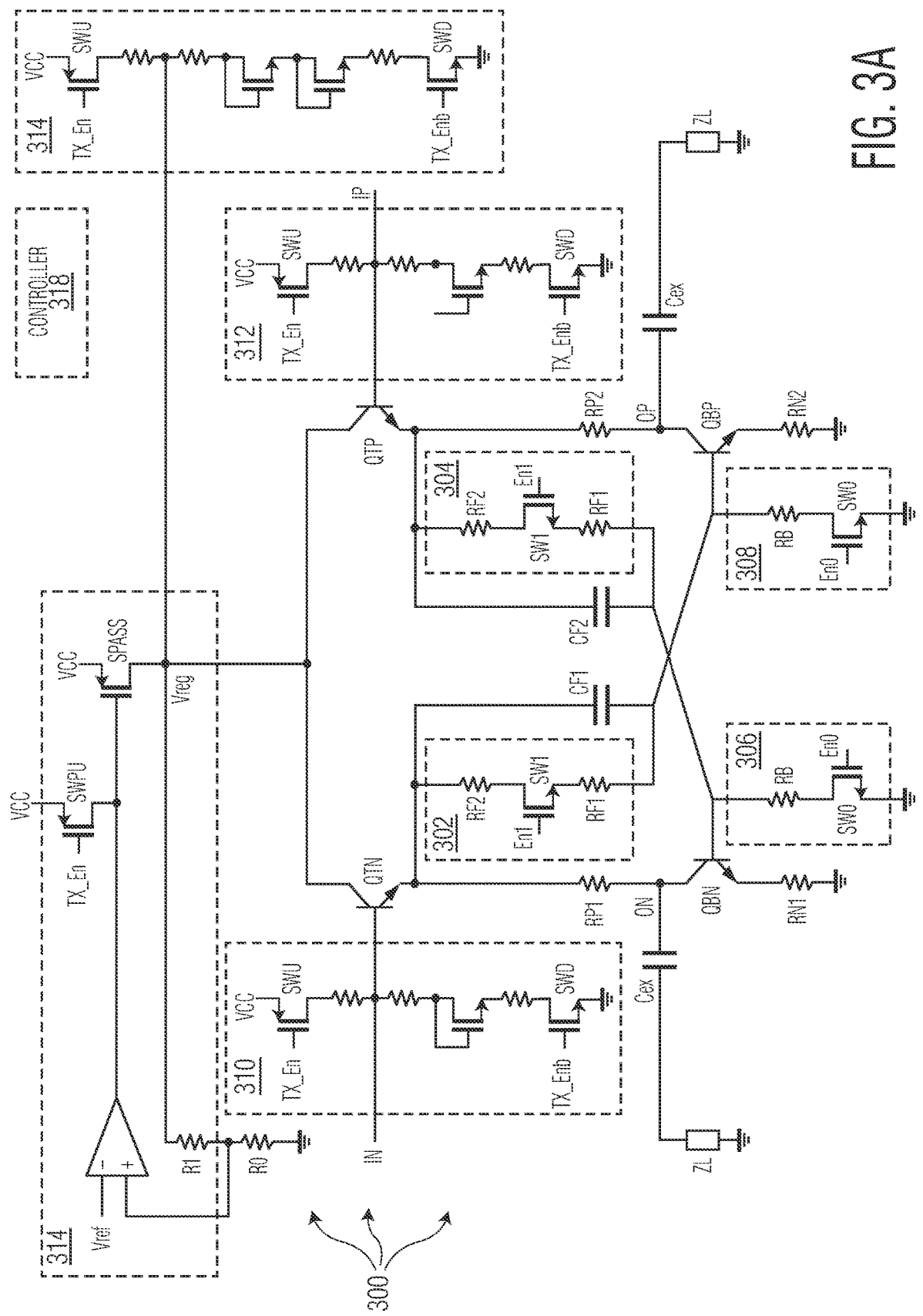
FIGS. 3A, 3B, 3C, 3D, 3E, 3F represent a third example TX driver circuit and controller circuitry.
Figure 3B:
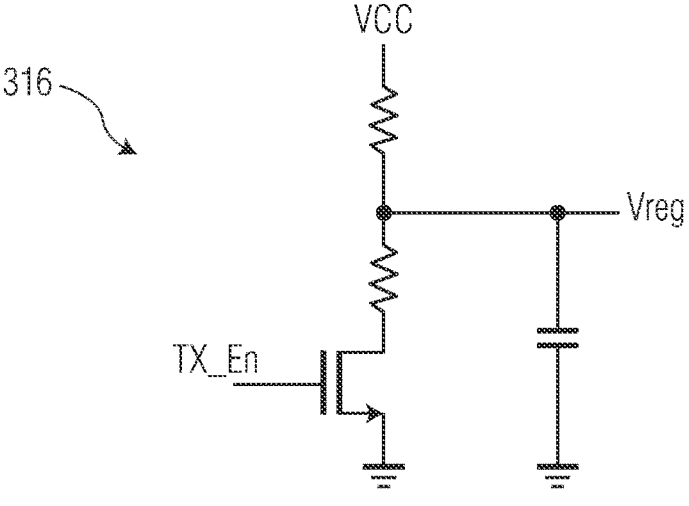
Figure 3C:
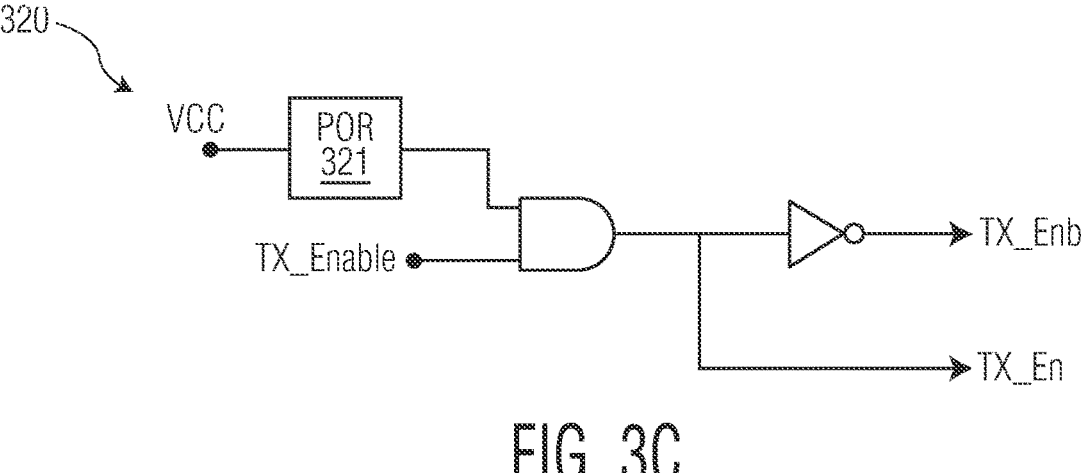

First controller sub-circuit 320 discussion:

FIG. 3C shows an example first controller sub-circuit 320 for generating the an enable signal (TX_En) and its logical complement (TX_Enb) in response to the TX_Enable signal.

In various example embodiments, the first controller sub-circuit 320 includes a POR (power on reset) circuit 321. The POR circuit 321 has a reset threshold. The reset threshold of the POR circuit is configured to detect a ramp-down of the power supply and to detect a ramp-up of the power supply a preset time period after the power supply begins the ramp-up. The set of sub-circuits 320, 322, 324 in the driver circuit are configured to receive the driver enable signal (TX_Enable) and in response control their operation. In some example embodiments, the POR circuit 321 reset threshold voltage is higher than a POR circuit (not shown) threshold in the power supply, so that the POR circuit 321 can detect the ramp-down of the power supply before the power supply itself is configured to detect the ramp-down.

In various example embodiments, a threshold of the POR circuit 321 is set slightly higher than threshold of any other POR in a redriver circuit which is being used for digital as an indicator of $V_{CC}$. For example, if another POR in the redriver circuit has a threshold of 2.5V, then the POR circuit's 321 threshold is set to 2.8V.

Using the first controller sub-circuit 320 (e.g. the POR circuit) if chip power suddenly goes away, the POR circuit 321 will disable all channel activities, especially the terminations, as soon as it detects the power ramp-down event. This helps to increase the pin impedance immediately, which can reduce any voltage jump/spike ($\Delta V$).

Voltage regulator 314, 316 discussion:

Either of the first or second voltage regulators 314, 316 are configured to couple the first transistor ($Q_{TN}$) and the second transistor ($Q_{TP}$) to the power supply input ($V_{CC}$) if the enable signal (TX_En) is in a first state and to a voltage set by the resistors and diode connected devices if the enable signal (TX_En) is in a second state.

The first example voltage regulator (Vreg) 314 is shown in FIG. 3A. When TX_En=0, the gate of the $S_{PASS}$ transistor in the regulated core supply voltage (Vreg) 314 will be connected to $V_{CC}$ to ensure that no power will be consumed in TX driver since its source is disabled.

In parallel, the switches $S_{WU}$ and $S_{WD}$ in the regulated core supply voltage (Vreg) 314 will be enabled. $S_{WU}$ and $S_WD$ consume a mico-ampere (uA) current to keep Vreg around its nominal voltage (~2.5V) to enable a fast start up scheme. Their added diode connected devices and resistors are adjusted to provide a desired voltage for Vreg before the redriver circuit's 300 channel is turned on, and at the same time they limit their power consumption.

Thus, the voltage regulator (Vreg) 314 switches (i.e. $S_{WPU}$, $S_{PASS}$, $S_{WU}$, and $S_{WD}$) reduce any voltage jump/spikes on the first and second differential outputs (OP, ON) by providing a more controlled Vreg voltage sent to $Q_{TN}$ and $Q_{TP}$.

The second example voltage regulator (Vreg) 316 is shown in FIG. 3B and is also controlled by the enable signal (TX_En) as shown.

Input switches 310, 312 discussion:

The first and second differential input switches are configured to couple the first and second differential inputs (IN, IP) to a first voltage if the enable signal (TX_En) is in a first state and to a second voltage if the enable signal (TX_En) is in a second state.

The first and second differential input switches 310, 312 keep the $Q_{TN}$ and $Q_{TP}$ transistor's base DC voltage in a predetermined "on-state voltage range" during ramp-up, and in a predetermined "off-state voltage range" during ramp-down to reduce any voltage jump/spike ($\Delta V$).

For example, if external chip 206 and external chip 208 in FIG. 2 have 200 k$\Omega$ far end terminations, since $R_P$ is ~50$\Omega$, any un-damped/blocked voltage jump on the $Q_{TN}$ and $Q_{TP}$ base pins will directly goes to the external chip 206 and external chip 208 pins.

The first and second differential input switches 310, 312 have a resistor divider configuration (i.e. $S_{WU}$, $S_{WD}$, resistances and diode coupled devices) that control the first and second differential inputs (IN, IP) voltages when TX_en=0 to keep a DC value of base of $Q_{TP}/Q_{TN}$ close to its functional mode voltage (e.g. keeping the gate voltages of $Q_{TP}$ and $Q_{TN}$ at around ~1V) before the driver circuit 300 is turned on.

Second controller sub-circuit 322 and third and fourth switched resistances 306, 308 discussion:

The switched resistances 302, 304, 306, 308 help isolate the core transistors of the TX driver circuit 102 from direct impact of operational mode changes such as power supply ramp-up/down and also improve stability of SI and analog performance, as will be further discussed below.

Figure 3D:
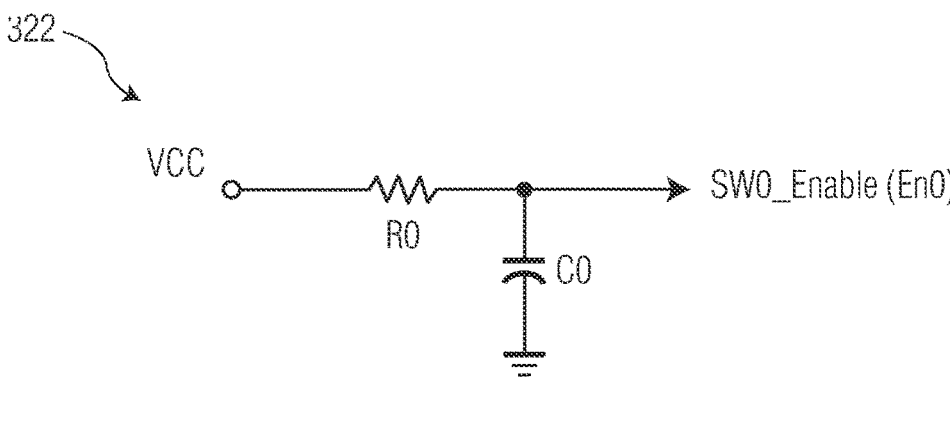

FIG. 3D shows an example second controller sub-circuit 322 configured to generate a delayed SWO_Enable (En0) signal to the third and fourth switched resistances 306, 308 after a predetermined delay from when a voltage signal at the power supply input ($V_{CC}$) changes (e.g. in response to power supply ramp-up and ramp-down).

Figure 3E:
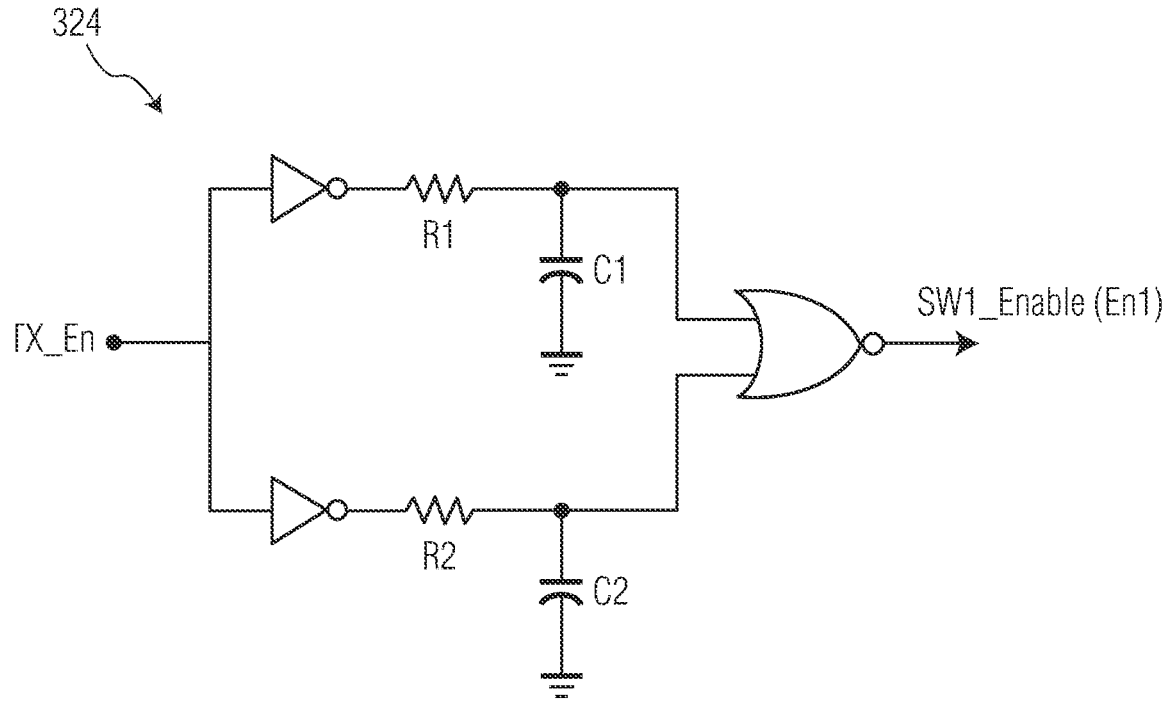

Third controller sub-circuit 324 and first and second switched resistances 302, 304 discussion:

FIG. 3E shows the example third controller sub-circuit 322 which is configured to send an enable signal (SW1_Enable (En1)) to the first and second switched resistances 302, 304 after a first delay (t1) from when the enable signal (TX_En) from the first controller sub-circuit 320 transitions from a first state to a second state, and after a second delay (t2) from when the enable signal (TX_En) transitions from the second state to the first state. In this example embodiment, the third controller circuit 324 is configured as a one-shot circuit.

The third controller sub-circuit 324 provides the first delay (t1) of the TX_En signal during ramp-up of the power supply to then switch-on/enable the $R_{F1}$ and $R_{F2}$ resistor paths in parallel with both $C_{F1}$ and $C_{F2}$. The third controller sub-circuit 324 also provides the second delay (t2) of the TX_En signal during ramp-down of the power supply to then switch-off the $R_{F1}$ and $R_{F2}$ resistor paths in parallel with both $C_{F1}$ and $C_{F2}$.

After the first delay (t1), the switched resistor's 302, 304 RF1 and RF2 resistance paths are turned on to set a CM (common mode) voltage at the first differential output (OP) and the second differential output (ON) by turning on $Q_{BP}$ and $Q_{BN}$.

The first delay (t1) avoids turning on $Q_{BP}$ and $Q_{BN}$ during operational mode changes (i.e. too soon before ramp-up and later during ramp-down). As a result, transient voltage jump on the first differential output (OP) and the second differential output (ON) is minimized.

Also, when the channel is turned off by setting TX_Enable=0, the second delay (t2) avoids abrupt output CM jump by turning-off $Q_{BP}$ and $Q_{BN}$ after $Q_{TP}$ and $Q_{TN}$ are turned-off. In various example embodiments, t1 is different from t2 to provide the capability of optimizing channel turning on/off response separately.

Figure 3F:
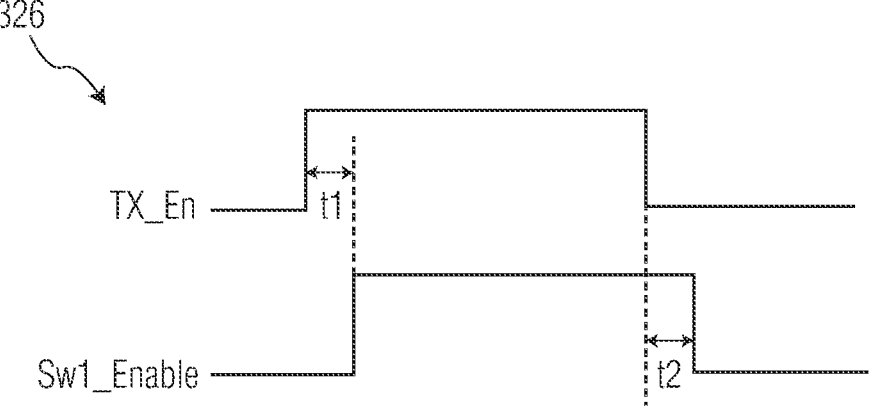

FIG. 3F shows a timing diagram 326 of a relation between the TX_En signal and the Sw1_Enable signal, including the first delay (t1) and the second delay (t2).

Figure 4:
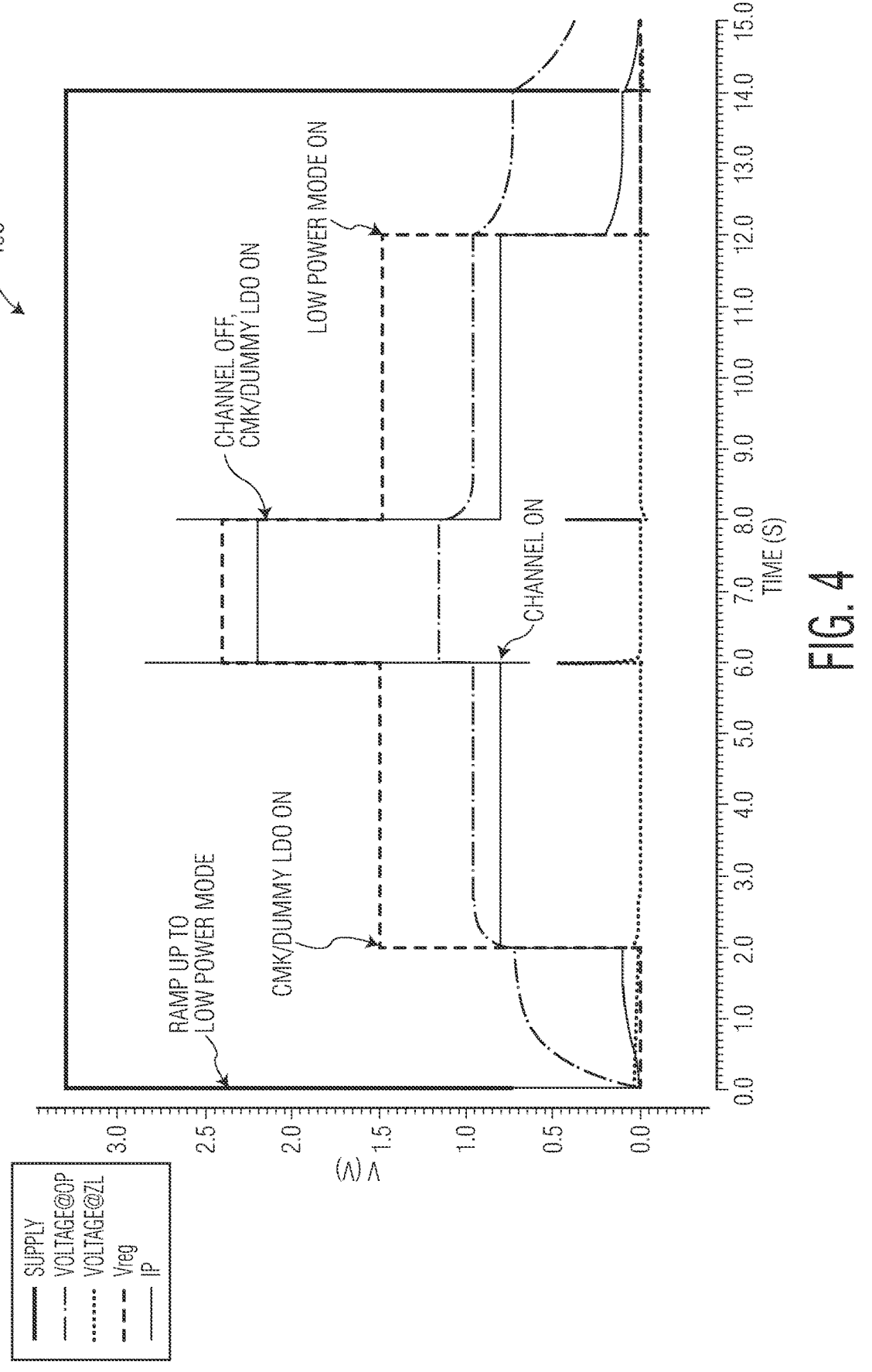
FIG. 4 represents an example graph of various signals in the third driver circuit during operation and mode changes.

FIG. 4 represents an example graph of various signals in the driver circuit 300 during operation and mode changes. Voltage jump at the input and output of the high-speed redriver and the related far-end termination which is limited due to the applied techniques is seen. Also, voltage of the regulator and LDO in ON and OFF modes are shown. The whole high-speed redriver is going from OFF mode to ON mode and again to OFF mode.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A driver circuit, comprising:
   a first transistor ($Q_{TN}$) coupled to a first differential input (IN) and a power supply input (VCC);
   a second transistor ($Q_{TP}$) coupled to a second differential input (IP) and the power supply input;
   a third transistor ($Q_{BN}$) coupled to a first differential output (ON);
   a fourth transistor ($Q_{BP}$) coupled to a second differential output (OP);
   a first resistance ($R_{P1}$) coupling the first transistor ($Q_{TN}$) to the third transistor ($Q_{BN}$);
   a second resistance ($R_{P2}$) coupling the second transistor ($Q_{TP}$) to the fourth transistor ($Q_{BP}$);
   a first capacitance ($C_{F1}$) coupling the first transistor ($Q_{TN}$) to a control line of the fourth transistor ($Q_{BP}$);
   a second capacitance ($C_{F2}$) coupling the second transistor ($Q_{TP}$) to a control line of the third transistor ($Q_{BN}$); and
   a controller coupled to the power supply input and configured to generate an enable signal (TX_En);
   wherein the driver circuit includes a voltage regulator circuit coupled between the power supply input and both the first transistor ($Q_{TN}$) and the second transistor ($Q_{TP}$); and
   wherein the voltage regulator circuit is configured to couple the first transistor ($Q_{TN}$) and the second transistor ($Q_{TP}$) to the power supply input ($V_{CC}$) if the enable signal (TX_En) is in a first state and to a voltage set by resistor and diode connected devices if the enable signal (TX_En) is in a second state.

2. The driver circuit of claim 1:
   wherein the controller is configured to detect a ramp-down of a power supply coupled to the power supply input and in response disable a set of circuits in the driver circuit; and
   wherein the controller is configured to detect a ramp-up of the power supply a preset time period after the power supply begins the ramp-up.

3. The driver circuit of claim 1:
   wherein the set of circuits in the driver circuit includes a first set of differential input (IP) switches coupled to the first differential input (IN) and a second set of differential input (IN) switches coupled to the second differential input (IP); and
   wherein the first and second differential input switches are configured to couple the first and second differential inputs to a first voltage if the enable signal (TX_En) is in a first state and to a second voltage if the enable signal (TX_En) is in a second state.

4. The driver circuit of claim 1:
   wherein the controller is configured to generate the enable signal (TX_En) in response to receiving another enable signal (TX_Enable); and
   wherein a set of circuits in the driver circuit are configured to receive the enable signal (TX_En) and in response control their operation.

5. The driver circuit of claim 4:
   wherein the controller includes a POR (power on reset) circuit.

6. The driver circuit of claim 5:
wherein the POR circuit has a reset threshold voltage that is higher than a predetermined value for power indication usage.

7. The driver circuit of claim 5:
wherein a reset threshold of the POR circuit is configured to detect the ramp-down of the power supply.

8. The driver circuit of claim 5:
wherein a reset threshold of the POR circuit is configured to detect a ramp-up of the power supply a preset time period after the power supply begins the ramp-up.

9. The driver circuit of claim 2:
wherein the controller is configured to detect the ramp-down of the power supply coupled to the power supply input before the power supply is configured to detect the ramp-down.

10. The driver circuit of claim 1:
wherein the driver circuit is embedded in a redriver circuit.

11. The driver circuit of claim 10:
wherein the redriver circuit is a voltage-mode redriver circuit.

12. The driver circuit of claim 1:
wherein the first differential output (OP) and the second differential output (ON) are configured to be directly connected to a capacitor in-series; and
wherein the first differential input (IP) and the second differential input (IN) are configured to be directly connected to a capacitor in-series.

13. The driver circuit of claim 1:
wherein the third transistor (QBN) is configured to be coupled to a load through a first decoupling capacitor (Cex) that is in-series with the first load; and
wherein the fourth transistor (QBP) is configured to be coupled to the load through a second decoupling capacitor (Cex) that is also in-series with the load.

14. A driver circuit, comprising:
a first transistor ($Q_{TN}$) coupled to a first differential input (IN) and a power supply input (VCC);
a second transistor ($Q_{TP}$) coupled to a second differential input (IP) and the power supply input;
a third transistor ($Q_{BN}$) coupled to a first differential output (ON);
a fourth transistor ($Q_{BP}$) coupled to a second differential output (OP);
a first resistance ($R_{P1}$) coupling the first transistor ($Q_{TN}$) to the third transistor ($Q_{BN}$);
a second resistance ($R_{P2}$) coupling the second transistor ($Q_{TP}$) to the fourth transistor (QBP);
a first capacitance ($C_{F1}$) coupling the first transistor ($Q_{TN}$) to a control line of the fourth transistor ($Q_{BP}$);
a second capacitance ($C_{F2}$) coupling the second transistor ($Q_{TP}$) to a control line of the third transistor ($Q_{BN}$);
a first switched resistance coupled in parallel with the first capacitance ($C_{F1}$);

12 a second switched resistance coupled in parallel with the second capacitance ($C_{F2}$);
a third switched resistance coupling the control line of the third transistor (QBN) to a ground; and
a fourth switched resistance coupling the control line of the fourth transistor (QBP) to the ground.

15. The driver circuit of claim 14:
a controller including a first controller sub-circuit coupled to the power supply input; and
wherein the first controller sub-circuit is configured to send an enable signal (SWO_Enable (En0)) to the third and fourth switched resistances after a predetermined delay from when a voltage signal at the power supply input ramps-up or ramps-down.

16. The driver circuit of claim 14:
wherein the controller includes a second controller sub-circuit coupled to receive an enable signal (TX_En) from the controller; and
wherein the second controller sub-circuit is configured to send an enable signal (SW1_Enable (En1)) to the first and second switched resistances after a first delay (t1) from when the enable signal (TX_En) transitions from a first state to a second state, and after a second delay (t2) from when the enable signal (TX_En) transitions from the second state to the first state.

17. The driver circuit of claim 16:
wherein the second controller circuit is a one-shot circuit.

18. A driver circuit, comprising:
a first transistor ($Q_{TN}$) coupled to a first differential input (IN) and a power supply input (VCC);
a second transistor ($Q_{TP}$) coupled to a second differential input (IP) and the power supply input;
a third transistor ($Q_{BN}$) coupled to a first differential output (ON);
a fourth transistor ($Q_{BP}$) coupled to a second differential output (OP);
a first resistance ($R_{P1}$) coupling the first transistor ($Q_{TN}$) to the third transistor ($Q_{BN}$);
a second resistance ($R_{P2}$) coupling the second transistor ($Q_{TP}$) to the fourth transistor (QBP);
a first capacitance ($C_{F1}$) coupling the first transistor ($Q_{TN}$) to a control line of the fourth transistor ($Q_{BP}$);
a second capacitance ($C_{F2}$) coupling the second transistor ($Q_{TP}$) to a control line of the third transistor ($Q_{BN}$); and
a controller coupled to the power supply input and configured to generate an enable signal (TX_En);
wherein the driver circuit includes a first set of differential input (IP) switches coupled to the first differential input (IN) and a second set of differential input (IN) switches coupled to the second differential input (IP); and
wherein the first and second differential input switches are configured to couple the first and second differential inputs to a first voltage if the enable signal (TX_En) is in a first state and to a second voltage if the enable signal (TX_En) is in a second state.

* * * * *